US005828165A

United States Patent [19]

Clerc et al.

[11] Patent Number: 5,828,165
[45] Date of Patent: Oct. 27, 1998

[54] THERMIONIC CATHODE FOR ELECTRON TUBES AND METHOD FOR THE MANUFACTURE THEREOF

[75] Inventors: Guy Clerc; Jean de Cachard, both of Thonon-Les-Bains, France

[73] Assignee: Thomson-CSF, Paris, France

[21] Appl. No.: 796,694

[22] Filed: Mar. 4, 1997

[30] Foreign Application Priority Data

Mar. 5, 1996 [FR] France .................................. 96 02743

[51] Int. Cl.[6] ........................................ H10J 1/22
[52] U.S. Cl. ................................ 313/346 R; 313/346 DC
[58] Field of Search ........................ 313/346 DC, 346 R, 313/355

[56] References Cited

U.S. PATENT DOCUMENTS 1,794,298 2/1931 Just .
2,218,381 10/1940 Gooskens .
4,518,890 5/1985 Taguchi et al. .................. 313/346 DC
4,533,852 8/1985 Frank et al. ...................... 313/346 DC
5,059,856 10/1991 Derks ............................... 313/346 DC

FOREIGN PATENT DOCUMENTS 0 210 805 2/1987 European Pat. Off. .
182217 8/1923 United Kingdom .

*Primary Examiner*—Sandra L. O'Shea
*Assistant Examiner*—Joseph Williams
*Attorney, Agent, or Firm*—Oblon, Spivak, McClelland, Maier & Neustadt, P.C.

[57] ABSTRACT

Disclosed is a thermionic cathode for electron tubes comprising a material that has a substrate, a compound of an element forming an emitting monolayer, chosen from among the rare earth zirconates, rare earth hafnates, rare earth aluminates and rare earth berylates, and a reducing agent which, at the working temperature of the cathode, reacts with the compound releasing the element that forms the monolayer. Application in particular to electron grid tubes. FIG. 1.

19 Claims, 1 Drawing Sheet

THERMIONIC CATHODE FOR ELECTRON TUBES AND METHOD FOR THE MANUFACTURE THEREOF

BACKGROUND OF THE INVENTION

The invention relates to a thermionic cathode designed in particular for electron tubes as well as to the method of manufacture thereof.

Active vacuum components (electron tubes) such as grid tubes and microwave tubes comprise a cathode whose function is to emit electrons into the vacuum by thermionic effect.

The surface of a solid has a potential barrier preventing the leakage of those electrons that do not have sufficient energy to get liberated from this surface.

In a thermionic cathode, this energy is given to the electrons by the heating of the cathode. For example, in a tube comprising a hot cathode and an anode, if a positive increasing voltage is applied between these two electrodes, a stream of electrons from the cathode to the anode is obtained. This stream increases until saturation which is a function of temperature and the nature of the emitting substance of the cathode. The saturation current $I_0$ per unit of surface area is given by RICHARDSON-DUSHMANN's formula:

$$I_0 = AT^2 e^{-W_s}/KT$$

$W_s$ is the work of extraction of electrons from the emitting substance,

T is the absolute temperature of the cathode,

K is the BOLTZMANN constant,

A is the RICHARDSON constant.

The work of extraction (or extraction work) $W_s$ is a characteristic of the emitting material.

For cathodes with a small surface area (of less than 100 $cm^2$), the emitting element is a mixture of alkaline earth oxides (barium, calcium and strontium).

In this type of massively formed cathode, the oxides are added either by deposition on the surface of the substrate or by impregnation in the mass of the substrate.

For cathodes with a large surface area (from 10 $cm^2$ to more than 1500 $cm^2$) there are known ways of making them with wires using material based on metal with a high melting point (refractory metal) such as for example tungsten. A large-area cathode of this type takes the form of a cylindrical cage whose strands are heated directly by the passage of the current.

This cylindrical structure is formed by a sort of meshwork that can be obtained for example by the soldering, at their points of intersection, of two sets of wires positioned obliquely on a cylinder.

In order to obtain high emitting power, the electron extraction work is reduced by means of a layer deposited on the metal surface of the cathode. This phenomenon is known as activation. Reaction thermionic cathodes use this principle. These cathodes are made of a material comprising a substrate containing at least one refractory metal, a compound of an element forming an emitting monolayer layer (a monoatomic layer) and a reducing agent that reacts with the compound to release the element forming the monolayer on the surface and having the effect of reducing the electron extraction work for extracting electrons from the surface of the cathode.

In this type of cathode, the element forming the emitting monolayer is kept during the lifetime of the cathode in the volume of the material of the cathode as a reserve.

The element forming a monolayer is released at the surface by reduction and diffusion. This is done constantly throughout the lifetime of the cathode with a reaction speed suited to the rate of evaporation of the emitting monolayer.

For example, there is a known way of making large-area cathodes with high emitting capacity by means of tungsten wires (as the substrate) for which the emission of electrons is given by the presence of about 1% of thorium oxide in the composition of the wire. This oxide is dispersed in granular form in the volume of the wire and is introduced during the sintering and reduction of the tungsten oxide powder which is the raw material for the preparation of the wire. By a process of carburization, a gain of tungsten carbide is created on the surface of the wire of the cathode. This gain will make it possible, during the operation of the tube, to reduce the thorium oxide and diffuse the thorium to the surface, covering it with an emitting monoatomic layer. These conventional cathodes are characterized by a long useful life of over 20,000 hours and a high operating temperature of about 1700° C. The drawback of these cathodes lies in the presence of thorium in their composition. Thorium is a radioactive emitting element with a half life of $1.4\ 10^{10}$ years. This necessitates handling precautions when thorium takes the form of powder and dictates the recycling of the wastes at the end of the life of the tubes.

To overcome this drawback, it is sought to replace thorium by other elements with low electron extraction work (for thorium in a monolayer, the extraction work is 2.7 eV) and low vapor pressure in the metal state at the working temperature of the cathode.

Elements capable of fulfilling these criteria form part of the group of rare earths.

Studies have been and are presently being conducted on cathodes based on rare earth oxides either by themselves or mixed with one another. Patents have been taken out by BROWN BOVERI published under numbers FR-A-2 237 303, FR-A-2 425 144, FR-A-2 290 025 and tests have been conducted.

The mode of action of these cathodes relies on the release of the metal from the rare earths by the reduction of the compound based on rare earths and the formation of an emitting monoatomic layer on the surface of the cathode.

The electron emission of these types of cathodes is satisfactory at temperatures in the range of 1500° C., that is to say 200° C. lower than it is for thoriated tungsten cathodes. The drawback of these cathodes, made of a material based on rare earth oxides, lies in their small lifetime of some tens of hours which is insufficient as compared with the minimum of 10,000 hours needed. The small lifetime of these cathodes is related to the lack of stability of this type of material when it comes under high temperature.

For example, in the case of the making of a cathode based on rare earths whose substrate is made of tungsten, comprising a reducing agent constituted by tungsten carbide, the tungsten, its carbide and the residual gases act as reducing agents for the rare earth oxides. The metal elements formed then have a high speed of diffusion and soon reach the surface of the cathode from where they are evaporated.

In the case of cathodes working at lower temperature, their lifetime is particularly improved by reinforcing the stability of the oxides which are agents of electron emission.

In oxide-based cathodes and impregnated cathodes, the stability of the barium oxide is obtained in two different ways to take account of the respective operating temperatures of 830° C. and 1050° C.

The oxide-based cathodes work at 830° C. and the stability of barium oxide is obtained by mixing it with calcium oxides and strontium oxides which are thermally more stable under vacuum.

The impregnated cathodes work at 1050° C. The stability at this temperature is obtained by the addition of aluminum oxide to the calcium, strontium and barium oxides.

The proportions of these mixtures may vary as a function of the characteristics desired for the cathode: lifetime, density of emission, evaporation of barium.

For cathodes based on rare earth oxides, tests of mixtures of these oxides have been made without any satisfactory result as regards the lifetime. Tests on mixtures of lanthanum oxides and cerium oxides have been made with lifetimes of some tens of hours. These results can be explained by characteristics of thermal stability under vacuum. These characteristics are very similar in these different oxides. Their mixture brings but little improvement in their behavior under vacuum.

The densities of electron emission required in electron tubes make it necessary, with cathodes based on rare earth oxides, to work at high temperatures of the order of 1500° C. while having a minimum lifetime of the order of 10,000 hours. Under vacuum, few oxides have sufficient stability to be used in a mixture with the rare earths.

SUMMARY OF THE INVENTION

To resolve the problem of an excessively short lifetime, encountered in the prior art for cathodes based on rare earths, working at high temperatures of the order of 1,500° C., the present invention proposes the making of a thermionic cathode for electron tubes comprising a material that has:

a substrate made of a refractory metal;

a compound of an element forming an emitting monolayer;

a reducing agent which, at the working temperature of the cathode, reacts with the compound releasing the element that forms the emitting monolayer.

The cathode is characterized in that the compound is chosen from among the rare earth zirconates, rare earth hafnates, rare earth aluminates and rare earth berylates.

For example, in the case of the making of a cathode with a substrate based on a refractory metal and a compound made of neodymium zirconate ($Zr_2Nd_2O_7$), the compound is obtained from a mixture of zirconium oxide ($ZrO_2$) and neodymium oxide ($Nd_2O_3$).

The free enthalpy of formation is characteristic of the stability of the compound.

The free enthalpy of formation is:

1043 kJ/mole for zirconium oxide, 1720 kJ/mole for neodymium oxide, 3845 kJ/mole for the neodymium zirconate compound.

The proportions of the mixtures must be suited to the characteristics required for the cathodes such as very long life or high density of emission.

BRIEF DESCRIPTION OF THE DRAWINGS

The invention will be understood more clearly from the following detailed description of embodiments of cathodes as well as the methods of their manufacture, made with reference to the appended drawings, of which.

MORE DETAILED DESCRIPTION

Several methods can be used to make the material of the cathode. For example:

the compound is obtained:

- either metal oxides and rare earth oxides are mixed in powder form and then these oxides are melted to obtain for example a rare earth zirconate or aluminate, then after cooling and solidification, the product obtained is reduced into a powder with the desired grain size
- or the powder of the compound with the necessary grain size is obtained directly by means of a sol-gel method;

the compound in powder form is introduced with the requisite percentage into the initial phases for the making of the refractory metal (substrate) used to manufacture the cathode.

An example of the manufacture of a cathode according to the invention, with a compound constituted by lanthanum zirconate and a substrate of tungsten, comprises at least the following steps:

- the mixing of about 30% of lanthanum oxide in powder form and about 70% of zirconium oxide in powder form;
- the placing of the mixture of the powders at melting temperature under vacuum or under hydrogen;
- after cooling, the crushing and then the grinding of the solid obtained, to get a powder with a grain size of about 1 to 5 micrometers;
- the introduction of the lanthanum zirconate in powder form at the sintering stage and the reduction of the tungsten oxide powder (substrate);
- the manufacture of the cathode by known methods.

In another exemplary embodiment of a cathode, the compound is cerium aluminate made with about 60% of aluminum oxide and about 40% of cerium oxide.

A cerium aluminate powder is obtained by means of a known sol-gel method which, by precipitation, leads to the formation of a powder with the desired grain size. The rest of the known method of manufacture of the cathode is the same.

These examples are not exhaustive either for the proportions of the mixture or for the rare earth elements that may be used. In particular, mixtures of rare earths may go into the composition of the zirconate, hafnate, aluminate or berylate of rare earths. In any case, the proportion of rare earths with respect to zirconium, hafnium, aluminum or beryllium should not go below about 30% to ensure a sufficient quantity of emitting material in the tungsten wire.

In short, the use of zirconates, hafnates, aluminates or berylates of rare earths to make the compound is not limited to the examples referred to, for the thermal stability under vacuum obtained permits numerous configurations.

Figure 1:
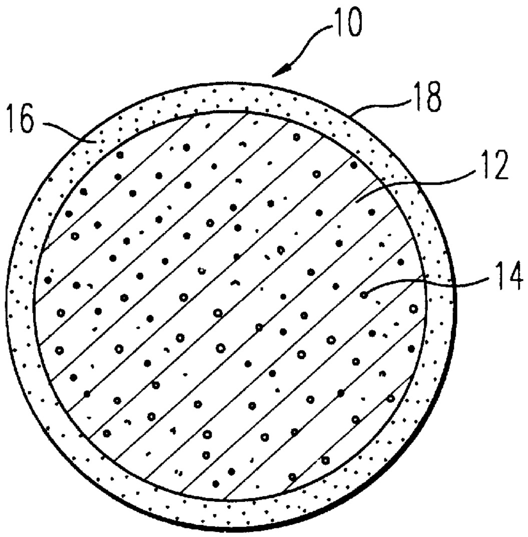
FIG. 1 shows a cross-section of a wire used to make a cathode according to the invention, in which the compound is dispersed in the volume of the wire.

The use of tungsten-based wires facilitates the making of large-area cathodes. FIG. 1 shows a cross-section of a wire 10, for example a round cross-section, used for the manufacture of a thermionic cathode according to the invention.

The wire has:

- a substrate 12 made of tungsten and a compound 14 of an element based on rare earths, according to the invention, dispersed in the volume of the wire 10;
- a reducing agent 16 constituted by tungsten carbide which, by reduction of the compound 14, covers the surface of the wire 10 with an emitting monolayer 18 of the metal of the compound 14.

The compound 14 is introduced at the initial stages in the making of tungsten bars used to draw the wire 10 with which the cathode is made. It is preferable that the compound 14 should stay in small proportions, less than about 2% in tungsten-based wire, to enable the drawing and so that the wire keeps mechanical properties that permit it to be shaped during the manufacture of the cathode.

In certain cases, for smaller-sized cathodes, it may be preferable to use the zirconate, hafnate, aluminate or berylate compound in the form of a deposit in thin layers on a support providing for the direct heating of the emitting cathode.

Figure 2:
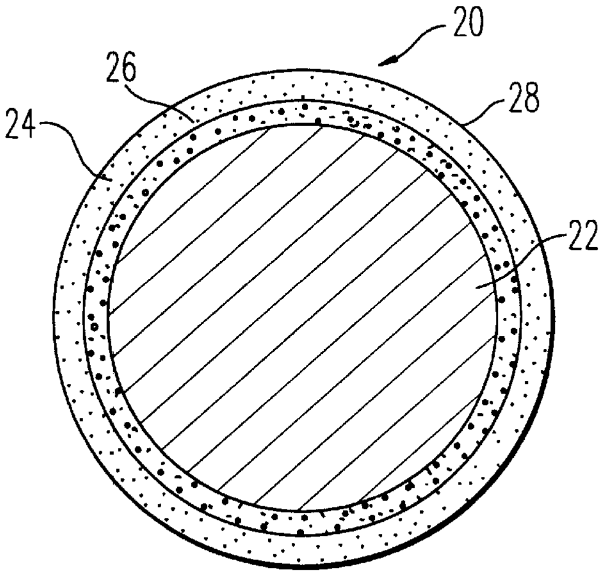
FIG. 2 shows a cross-section of a wire used to make a cathode according to the invention, in which the compound is in the form of a deposit on the surface of the substrate.

FIG. 2 shows a cross-section of a wire 20, for example a round section, used to make a thermionic cathode according to the invention.

The wire 20 comprises:

a substrate 22, for example made of tungsten;

a reducing agent 26 constituted by tungsten carbide on the surface of the substrate 22;

a compound 24 of an element based on rare earth, deposited in thin layers directly on the reducing agent 26 by cathophoresis, migrating in the layer of the reducing agent 26.

The compound 24 is reduced by the tungsten carbide during the working of the cathode, covering the surface of the wire 20 with an emitting monolayer 28 of the metal of the compound 24.

Figure 3:
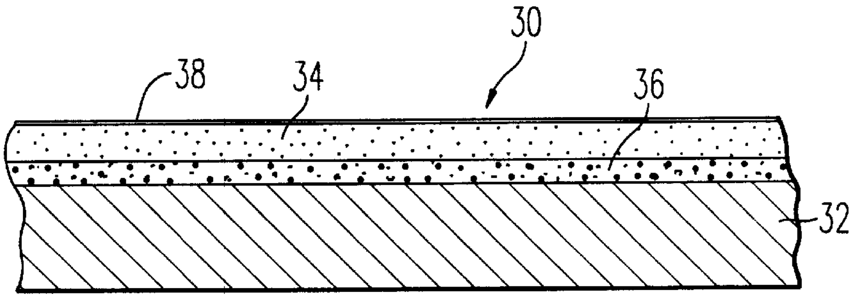
FIG. 3 shows a partial view of a massive cathode according to the invention, in which the compound of which is in the form of a deposit on the surface of the substrate.

In another example, FIG. 3 shows a portion of a massive cathode 30 that takes the form for example of a cylinder heated by a filament.

A substrate 32 made of refractory metal has, on the surface, a reducing agent 36 made of carbide of the refractory metal. A compound 34 of a rare earth based element is deposited in thin layers by cathophoresis on the surface of the reducing agent 36 and migrates in the layer of the reducing agent 36. The compound 34 is reduced by the refractory metal carbide, covering the surface of the cathode 30 with an emitting monolayer 38 of the metal of the compound 34.

While it is preferable to use a tungsten substrate for its mechanical properties in the form of wires, in the form of deposits covering a heating element or in massive form, other refractory metals may be used such as molybdenum, tantalum, hafnium and graphite.

What is claimed is:

1. A thermionic cathode for electron tubes comprising a material that has:

a substrate made of a refractory metal;

a compound of an element forming an emitting monolayer;

a reducing agent which, at the working temperature of the cathode, reacts with the compound releasing the element that forms the emitting monolayer, said thermionic cathode being a cathode wherein the compound is chosen from among the rare earth zirconates, rare earth hafnates, rare earth aluminates and rare earth berylates.

2. A thermionic cathode according to claim 1, wherein the compound is neodymium zirconate.

3. A thermionic cathode according to claim 1, wherein the compound is lanthanum zirconate.

4. A thermionic cathode according to claim 3, wherein the lanthanum zirconate is made with about 30% of lanthanum oxide and about 70% of zirconium oxide.

5. A thermionic cathode according to claim 3, wherein the lanthanum zirconate is a powder with a grain size of about 1 to 5 micrometers.

6. A thermionic cathode according to claim 1, wherein the compound is cerium aluminate.

7. A thermionic cathode according to claim 6, wherein the cerium aluminate is made with about 60% of aluminium oxide and about 40% of cerium oxide.

8. A thermionic cathode according to claim 1, wherein mixtures of rare earths go into the composition of the compound.

9. A thermionic cathode according to claim 1, wherein the proportion of rare earths with respect to zirconium, hafnium, aluminium or beryllium is greater than about 30%.

10. A thermionic cathode according to claim 1, wherein the material is in the form of wire.

11. A thermionic cathode according to claim 10 wherein, when the substrate is tungsten and the compound is dispersed in granular form in the volume of the substrate and of the reducing agent, the proportion of the compound is smaller than about 2% in the wire.

12. A thermionic cathode according to claim 1, wherein the material is in massive form.

13. A thermionic cathode according to claim 1, wherein the compound is dispersed in granular form in the volume of the substrate and of the reducing agent.

14. A thermionic cathode according to claim 1, wherein the compound is in the form of a deposit.

15. A thermionic cathode according to claim 1, wherein the refractory metal constituting the substrate is chosen from among tungsten, molybdenum, tantalum, hafnium and graphite.

16. A thermionic cathode according to claim 1, wherein the reducing agent comprises at least one carbide of a refractory metal.

17. A method for the manufacture of a thermionic cathode comprising a material that has:

a substrate made of a refractory metal;

a compound of an element forming an emitting monolayer, the compound being chosen from among the rare earth zirconates, rare earth hafnates, rare earth aluminates and rare earth berylates;

a reducing agent which, at the working temperature of the cathode, reacts with the compound releasing the element that forms the emitting monolayer;

and comprising at least the following steps:

the obtaining of the compound by the mixing and melting, under vacuum or under hydrogen, of a powdered metal oxide and at least one powdered rare earth oxide;

the cooling of the compound to bring it to the solid state;

the crushing and grinding of the compound in the solid state to obtain a powder with a determined grain size.

18. A method for the manufacture of a a thermionic cathode comprising a material that has:

a substrate made of a refractory metal;

a compound of an element forming an emitting monolayer, the compound being chosen from among the rare earth zirconates, rare earth hafnates, rare earth aluminates and rare earth berylates;

a reducing agent which, at the working temperature of the cathode, reacts with the compound releasing the element that forms the emitting monolayer;

and comprising the step during which the compound in powder form with the determined grain size is obtained by a sol-gel method.

19. A thermionic cathode according to claim 4, wherein the lanthanum zirconate is a powder with a grain size of about 1 to 5 $\mu$m.

* * * * *